United States Patent [19]
Mauthe et al.

[11] Patent Number: 6,067,036
[45] Date of Patent: May 23, 2000

[54] DEVICE FOR DIGITAL-ANALOG CONVERSION WITH HIGH LINEARITY

[75] Inventors: Manfred Mauthe, Grosshelfendorf; Jens Sauerbrey, Munich, both of Germany

[73] Assignee: Siemens Aktiengesellschaft, Munich, Germany

[21] Appl. No.: 09/071,151

[22] Filed: May 4, 1998

[30] Foreign Application Priority Data

May 28, 1997 [DE] Germany .......................... 197 22 434

[51] Int. Cl.[7] ....................................................... H03M 3/00
[52] U.S. Cl. ........................................... 341/143; 341/144
[58] Field of Search .................................... 341/143, 144, 341/166, 110, 118, 126, 172

[56] References Cited

U.S. PATENT DOCUMENTS

| | | | |
|---|---|---|---|
| 4,704,600 | 11/1987 | Uchimura et al. ....................... | 341/143 |
| 4,876,543 | 10/1989 | Van Bavel ................................ | 341/143 |
| 5,028,924 | 7/1991 | Thompson ................................ | 341/143 |
| 5,191,332 | 3/1993 | Shieu ........................................ | 341/143 |
| 5,231,395 | 7/1993 | Irwin et al. ............................... | 341/143 |
| 5,235,334 | 8/1993 | Manvar et al. ........................... | 341/143 |
| 5,392,040 | 2/1995 | Hayashi .................................... | 341/143 |
| 5,583,501 | 12/1996 | Henrion et al. .......................... | 341/143 |
| 5,608,401 | 3/1997 | Viswanathan et al. .................. | 341/143 |

OTHER PUBLICATIONS

"Integrated Analog–To–Digital And Digital–To–Analog Converters" by Rudy Van De Plassche—Kluwer Academic Publishers—pp. 367–381, (no date).

*Primary Examiner*—Howard L. Williams
*Assistant Examiner*—Jean B. JeanGlaude
*Attorney, Agent, or Firm*—Hill & Simpson

[57] ABSTRACT

A digital-analog converter having high linearity is based on two sigma-delta modulators of second order which are fed back in a cascaded fashion and via differentiators. The first modulator has a quantizer with only three stages, an output signal of which delivers an analog output signal via a three-stage digital-analog converter and a low-pass filter. The particularly high linearity, the good stability and the relatively large bandwidth with reference to clock frequency are advantages of the digital-analog converter.

5 Claims, 2 Drawing Sheets

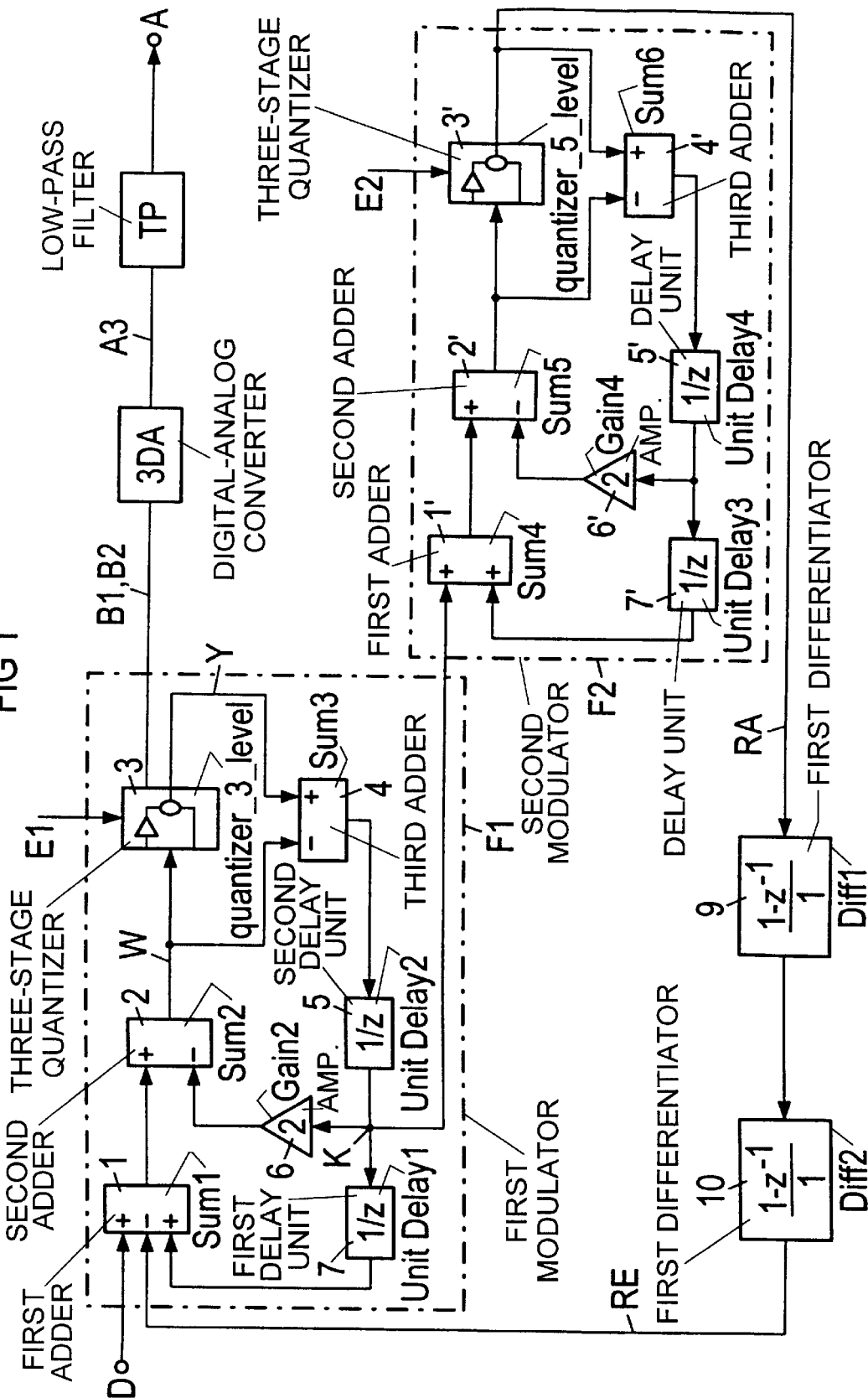

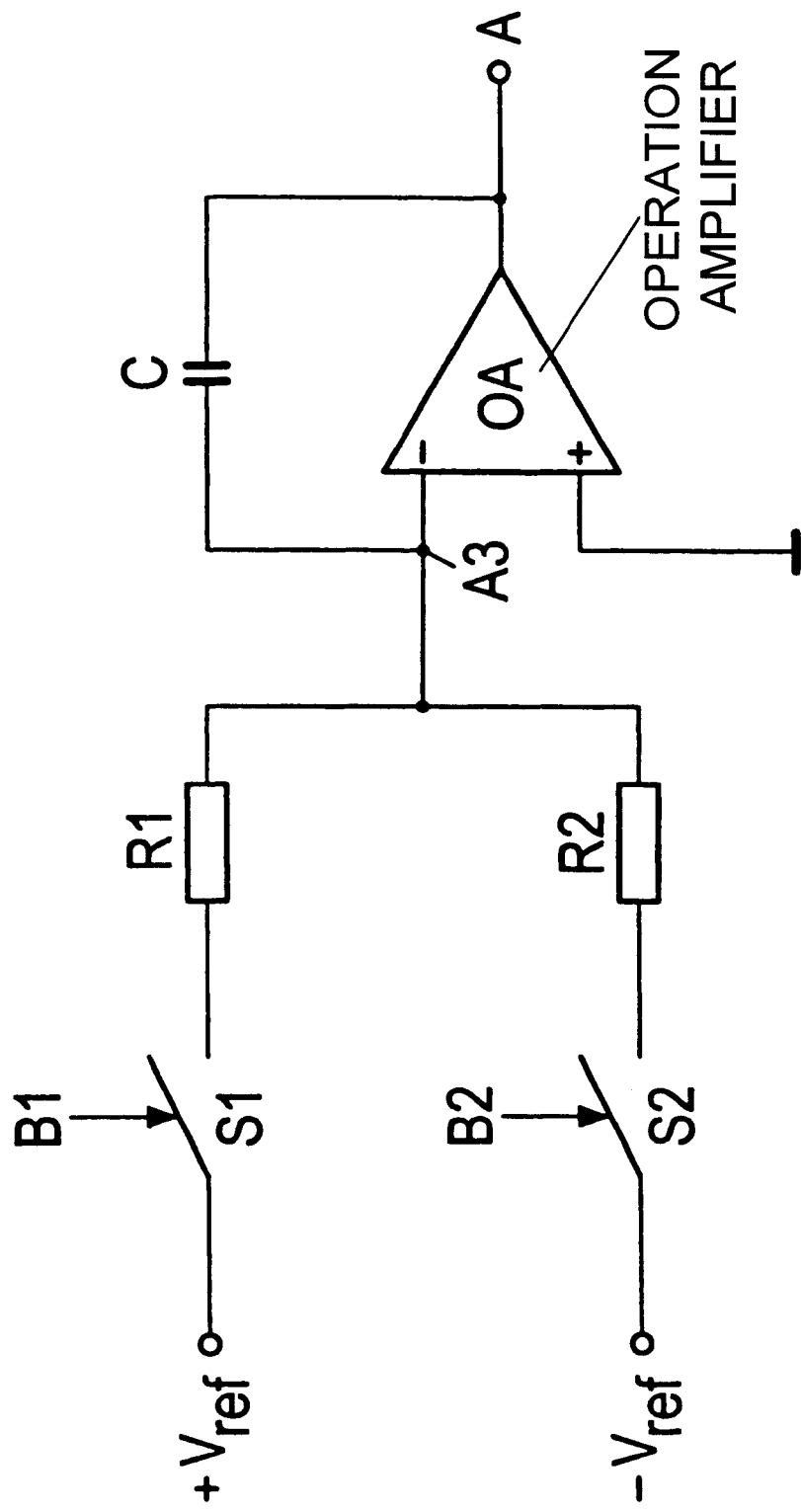

DEVICE FOR DIGITAL-ANALOG CONVERSION WITH HIGH LINEARITY

BACKGROUND OF THE INVENTION

In conventional converters with a pipelining structure or with successive approximation, as well as in what are known as delta-sigma converters, the quantizer of which comprises a large number of quantization stages, linearity problems arise due to component tolerances in resistor networks or in corresponding networks with connected capacitors. An extreme linearity can be obtained, given an output word width of one bit, through delta-sigma converters on the basis of what are known as noise shaping filters, and there are no special steps necessary for trimming resistors, or respectively, capacitors. However, given the same throughput, a low output bit width of the quantizer requires a higher clock frequency, which, for technological reasons, cannot be arbitrarily increased, however. To obtain an optimally large bandwidth at a certain clock frequency, noise shaping filters of third order or higher are needed which, however, would lead to instabilities, even given output word widths of several bits, as practice has demonstrated.

What are known as noise shaping filters of first, second, third and higher order are taught in the book "Integrated Analog-To-Digital And Digital-To-Analog Converters" by Rudy Van De Plassche, Kluwer Academic Publishers, Boston/Dordrecht/London, Chapter 10, pages 367 to 381.

U.S. Pat. No. 5,392,040 teaches a bit compression circuit for utilization in a delta-sigma D/A converter, wherein sampling data are converted into quantized data with low word width, and the quantization noise is fed back via a noise shaping filter.

SUMMARY OF THE INVENTION

It is an object of the present invention to propose a device for digital-analog conversion which is unconditionally stable in its operating behavior, which has an optimally large bandwidth at a certain clock frequency, and which is distinguished by a particularly high linearity.

According to the invention, a device for digital-analog conversion is provided having first and second delta-sigma modulators of second order, first and second differentiators, a three-stage digital-analog converter, and a low-pass filter, an output signal of the low-pass filter simultaneously representing an output signal of the device, and a digital input signal being fed to the first modulator. The signal between first and second delay units of the first modulator is fed to an input of the second modulator. An output signal of the second modulator is fed to a feedback input of the first modulator via first and second differentiators connected in series. In the first modulator, a three-stage quantizer delivers first and second area bits which are converted to an analog signal by the three-stage digital analog converter. The analog signal is fed to the low-pass filter.

BRIEF DESCRIPTION OF THE DRAWINGS

FIG. 1 is a block diagram of a preferred exemplary embodiment of the invention; and FIG. 2 is a detailed wiring diagram of a portion of FIG. 1.

DESCRIPTION OF THE PREFERRED EMBODIMENTS

FIG. 1 depicts a preferred exemplary embodiment of a device of the invention for digital-analog conversion with two second-order delta-sigma modulators (noise shaping filters) F1 and F2. A digital signal at the converter input D containing, for example, 16 bits is fed to the first modulator F1, which forms a modulator output signal Y and two area bits B1, B2 which can be converted into an analog output signal A with the aid of an only three-stage digital-analog converter 3DA and a low-pass filter TP connected downstream. A signal is further coupled out from the modulator F2 at a node K, this signal serving as an input signal for the second modulator F2. The modulator F2 comprises a feedback output RA connected to a feedback input RE of the modulator F1 via two differentiators 9 and 10 connected in series.

The modulator F1 comprises a first adder 1 with three inputs, wherein a positive input is connected with the converter input D, wherein a negative input is connected with the feedback input RE, and the output is connected with a positive input of a second adder 2 with two inputs. The output of the adder 2 delivers a signal W and is connected with the input of a three-stage quantizer 3, which forms the output signal Y and the area bits B1 and B2, wherein the bits B1 and B2 indicate which of the three stages is present at the quantization output. At its output Y, the quantizer 3 delivers the values 1, 0, or −1 as a digital value, for example. In a third adder 4, the input signal W is compared to the output signal Y of the quantizer 3, wherein the input signal is fed to the adder with a negative sign, and the output signal Y is fed to the adder 4 with a positive sign. The output of the adder 4 is connected to the node K via a delay unit 5, this node being connected, on its part, with a negative input of the adder 2—via an amplifier 6 comprising an amplification factor 2—as well as with a positive input of the adder 1—via another delay unit 7. Given an input word width of X bits, the modulator F1 must be designed with at least X+3 bits, so that overflow does not occur.

The modulator F2 is basically constructed like the modulator F1, wherein the corresponding components are designated 1'... 7' instead of 1... 7, and wherein the quantizer 3' can also comprise a higher number of stages, e.g. 5 stages, since the number of stages therein does not enter into the linearity of the converter, while the stability is improved with increasing number of stages. With five stages, for example, the quantizer can deliver the value 1, 0.5, 0, −0.5 or −1 as the digital value at its output. The two modulators F1 and F2 are connected in tandem; that is, the node K is connected with a positive input of the adder 1', which is designated 1 in the modulator F1 and which guides the digital input signal D. The output of the quantizer 3' in the modulator F2 delivers the feedback output signal RA. Given an input word width of X bits at the converter input, the modulator F2 would have to be designed with at least X+3+8 bits—given full resolution—so that overflow does not arise. However, it is sufficient to process only the X+3 bits of highest value in the modulator F2, since the signal/noise ratio is thereby only insignificantly worsened.

Assuming that the quantizer 3 effects a quantization noise E1, and the quantizer 3' effects a quantization noise E2, then the transmission function for the interconnection of the two modulators F1 and F2 can be indicated by the equation $$(z)=D(z)+(1-z)^3*E1(z)+(1-z)^4*E2(z)$$

It emerges therefrom that the quantization noise of the quantizer 3 with the third order is dimmed, and, as a whole, a behavior of a modulator of the third order is thus obtained.

FIG. 2 depicts a preferred exemplary embodiment of the three-stage digital-analog converter 3DA and the low pass filter TP. The three-stage digital-analog converter 3DA is formed of a switch S1 controlled by the bit B1, a switch S2 controlled by the bit B2, and two equally large resistors R1 and R2, wherein a positive reference voltage $V_{ref}$ can be respectively switched onto the output A3 via the switch S1 and the resistor R1, as can a negative reference voltage $V_{ref}$, via the switch S2 and the resistor R2, this output A3 being connected to a low-pass filter in the form of an integrator. The integrator comprises an operation amplifier OA, for example, and delivers an analog signal A at its output which is fed back to the input A3 via a capacitor C. If the two bits B1 and B2 are both 0 or 1, then the voltage 0 volts is present at the input A3; if the bit B=1 and the bit B2=0, then $+V_{ref}$ is present at the input A3, and if the bit B2=1 and the bit B1=0, then $-V_{ref}$ is present at the input A3.

If the circuit of FIG. 2 is realized not with resistors, but with switched capacitors (SC technology), then it is possible to propose such a circuit with only a single switching capacitor instead of the two resistors R1 and R2—which are burdened with tolerances—and thus to obtain the highest degree of linearity.

Although various minor changes and modifications might be proposed by those skilled in the art, it will be understood that our wish is to include within the claims of the patent warranted hereon all such changes and modifications as reasonably come within our contribution to the art.

We claim as our invention:

1. A device for digital-analog conversion, comprising:

first and second delta-sigma modulators of second order, first and second differentiators, a three-stage digital-analog converter, and a low-pass filter, an output signal of the low-pass filter simultaneously representing an output signal of the device, and a digital input signal being fed to the first modulator;

a signal between first and second delay units of the first modulator being fed to an input of the second modulator;

an output signal of the second modulator being fed to a feedback input of the first modulator via said first and second differentiators connected in series; and in the first modulator, a three-stage quantizer delivers first and second area bits which are converted to an analog signal by the three-stage digital-analog converter, and said analog signal being fed to the low-pass filter.

2. The device according to claim 1 wherein the first modulator as well as the second modulator each comprise a series connection of a first adder, a second adder, and a three-stage quantizer, input and output signals of the three-stage quantizer being compared via a third adder, a comparison signal of the third adder being fed to the second adder via the second delay unit and a respective amplifier, and to the first adder via the second delay unit and the first delay unit.

3. The device according to claim 1 wherein the three-stage digital-analog converter and the low-pass filter are formed such that an operation amplifier is provided, an output of the amplifier simultaneously forming the output of the device, said output being fed back onto an inverted input of the operation amplifier via a capacitor, said inverted input being connected with a positive reference voltage via a first switch controlled by the first area bit and a resistor, and being connected with a negative reference voltage via a second switch controlled by the second area bit and a second resistor.

4. The device according to claim 1 wherein the three-stage digital-analog converter is formed such that switches thereof are controlled by the area bits, and the low-pass filter is formed by an operation amplifier which is fed back via a capacitor onto an inverted input of the operation amplifier.

5. A device for digital-analog conversion, comprising:

first and second delta-sigma modulators of second order, a differentiator arrangement comprising first and second differentiators, a three-stage digital-analog converter, and a low-pass filter, an output signal of the low-pass filter being fed to an output of the device, and a digital input signal being fed to the first modulator;

a signal from a delay unit arrangement of the first modulator being fed to an input of the second modulator;

an output signal of the second modulator being fed to a feedback input of the first modulator via said differentiator arrangement; and in the first modulator, a quantizer delivers first and second area bits which are converted to an analog signal by the digital-analog converter, said analog signal being fed to the low-pass filter.

* * * * *